United States Patent [19]

Ogawa et al.

[11] Patent Number: 4,920,011

[45] Date of Patent: Apr. 24, 1990

[54] MAGNETIC FIELD SHIELD INCLUDING A SUPERCONDUCTIVE FILM

[75] Inventors: Souichi Ogawa, Hyogo; Takao Sugioka; Masaru Inoue, both of Osaka, all of Japan

[73] Assignees: Osaka Prefecture; Koatsu Gas Kogyo Co. Ltd., both of Osaka, Japan

[21] Appl. No.: 260,604

[22] Filed: Oct. 20, 1988

[30] Foreign Application Priority Data

Feb. 9, 1988 [JP] Japan .................................. 63-28174
Aug. 10, 1988 [JP] Japan ................................. 63-200795

[51] Int. Cl.$^5$ ............................................. H05K 9/00
[52] U.S. Cl. .................................... 428/596; 428/627; 428/662; 428/930; 335/216; 335/301
[58] Field of Search ............... 428/596, 627, 662, 930, 428/457; 335/216, 301; 174/35 MS

[56] References Cited

U.S. PATENT DOCUMENTS

| H39 | 3/1986 | Gubser et al. ............... 174/35 MS |
| 4,797,646 | 1/1989 | Saji et al. ..................... 428/930 |
| 4,803,452 | 2/1989 | Saji et al. ..................... 428/930 |
| 4,828,931 | 5/1989 | Ogawa et al. ................ 428/596 |

FOREIGN PATENT DOCUMENTS 183979 8/1986 Japan .

*Primary Examiner*—L. Dewayne Rutledge
*Assistant Examiner*—George Wyszomierski
*Attorney, Agent, or Firm*—Koda & Androlia

[57] ABSTRACT

A magnetic field shield including a superconductive film characterized in that the magnetic field shield comprises a superconductive film layer constituted primarily of a mixed crystalline body of niobium nitride and titanium nitride laminated on a metal substrate, that the magnetic field further comprises a nobium-titanium alloy layer or a metal film layer in the above lamination, that the magnetic field comprises a plurality of the above-mentioned layers, and that the magnetic field has a plurality of small holes passing through the layers in the direction of the thickness. The magnetic field shield of the present invention produces an excellent magnetic field shielding effect due to a superconductive characteristic peculiar to the superconductive film layer constituted primarily by a mixed crystalline body of niobium nitride and titanium nitride. The cooling effect of the metal substrate maintains the magnetic field shielding effect at a high level. In addition, due to the use of the niobium-titanium alloy layer, the magnetic field shield has high resistance against peeling, greatly increasing the practical usefulness of the magnetic field shield. In the case of the magnetic field shield with a plurality of the laminated layers, the cooling effect of the metal film layers included in the multiple layers stably maintains the magnetic field shielding effect of the superconductive film layers. In the case of the magnetic field shield with small holes, the electromagnetic shielding and cooling effects of the holes are added to further strengthen the magnetic field shielding effect.

6 Claims, 3 Drawing Sheets

MAGNETIC FIELD SHIELD INCLUDING A SUPERCONDUCTIVE FILM

BACKGROUND OF THE INVENTION

1. Field of the Invention

The present invention relates to a magnetic field shield including a superconductive film which shields magnetic fields utilizing superconductivity. 2. Prior Art As a magnetic field shield utilizing superconductivity, the first class superconductor or the second class superconductor has been used depending on the intensity of a magnetic field. The magnetic field shield using the first class superconductor utilizes perfect diamagnetism (Meissner effect), a characteristic of superconductivity. This magnetic field shield cannot shield intense magnetic fields since its critical magnetic flux density is low. The magnetic field shield using the second class superconductor utilizes a mixture of the superconduction state and the normal conduction state, and its critical magnetic field is separated into the upper and lower critical magnetic fields. Since the intensity of the upper critical magnetic field is extremely high, the magnetic field shield using the second class superconductor can be used to shield intense magnetic fields.

With such a magnetic field shield using the second class superconductor, what is called "electromagnetic shielding effect" based on the interlinkage magnetic flux unchangeability principle can also be used to shield intense magnetic fields.

As the above-mentioned magnetic field shield becomes thicker, its shielding effect increases. Therefore, thicker superconductors are used to shield intense magnetic fields. However, a thick superconductor is heated by local magnetic flux flow, and its shielding effect reduces remarkably (secondary harmful effects). When shielding intense magnetic fields using the above-mentioned second class superconductor, relatively thick superconductive sheets or tapes are laminated in layers or laminated with aluminum or copper layers. These two types are inevitably thick and weighty. Thus they are not proper for practical use. In addition, the former type is apt to cause magnetic flux skip (magnetic fluxes enter the shield and move to the center of the shield, raising the internal temperature and allowing more magnetic fluxes to enter the shield, and resulting in a catastrophic phenomenon). The former type thus lacks stability required for shielding magnetic fields. The latter type is better than the former type in structure since the cooling effect due to aluminum or copper layers is added. However, this structure is not enough to fully deliver the characteristics of superconductive material. As this kind of magnetic filed shield is thicker, it produces a greater magnetic field shielding effect (the thickness of the superconductor is said to be proportional to the magnetic field shielding effect). Accordingly, instead of laminating layers of thin superconductive films, it has been considered to be advantageous to use a superconductor which should be as thick as possible, provided that any means for preventing heat generation described above is taken, since production cost and the number of processes can be reduced.

SUMMARY OF THE INVENTION

The inventors of the present invention carefully reviewed the fundamental characteristics of the above-mentioned second class superconductor and found that even a thin layer was able to deliver a superior magnetic field shielding effect by laminating a superconductive film, which is constituted primarily by a mixed crystalline body of niobium nitride and titanium nitride, on a metal substrate. It is therefore an object of the present invention to provide a novel magnetic field shield including a superconductive film. As described in Japanese patent application No. 60-024254, European patent application No. 8101613.7, U.S. patent application Ser. Nos. 142,282 and 139,604 and Canadian patent application No. 24254/1985, the inventors of the present invention previously found that a magnetic field shield comprising a plurality of superconductive film layers had a far greater shielding effect than a magnetic field shield having a single superconductive layer, even when these two types were the same in overall thickness. Based on this principle, the inventors provided a magnetic field shield including a superconductive film. By following the fundamental technical idea of the above-mentioned prior invention, the present invention provides a practically useful lamination structure having high resistance against peeling. In addition, as described in the Japanese patent application No. 62-068499, U.S. patent application Ser. No. 163,369, Canadian patent application No. 562092, U.K. patent application No. 8806772, French patent application No. 8803822 and West German patent application No. P 3809452.5, the inventors of the present invention proposed a magnetic field shield including a superconductive film, based on application of both the diamagnetic and electromagnetic shielding effects of a superconductive film. The inventors also found that an excellent magnetic field shielding effect were obtained by applying the idea of the present invention to the invention proposed above. The present invention provides a useful magnetic field shield including a superconductive film by incorporating the ideas of these prior inventions.

DETAILED DESCRIPTION OF THE INVENTION

Figure 1:
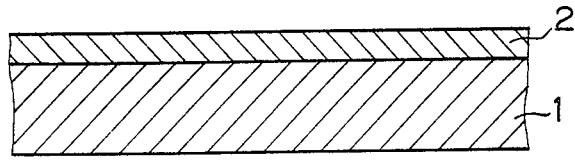
FIG. 1 is a vertical sectional view illustrating a fundamental example of a first embodiment of the magnetic field shield of the present invention.
Figure 2:
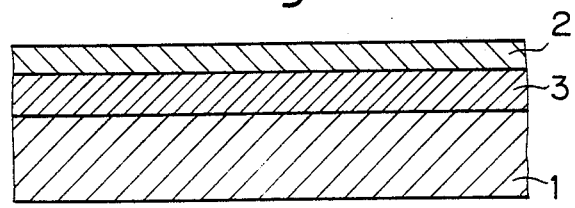
FIGS. 2 to 5 are vertical sectional views illustrating fundamental examples of second to fifth embodiments of the magnetic field shield of the present invention.
Figure 3:
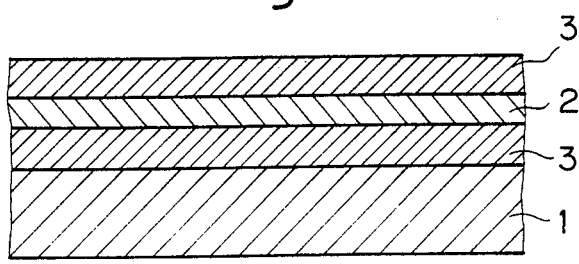
Figure 4:
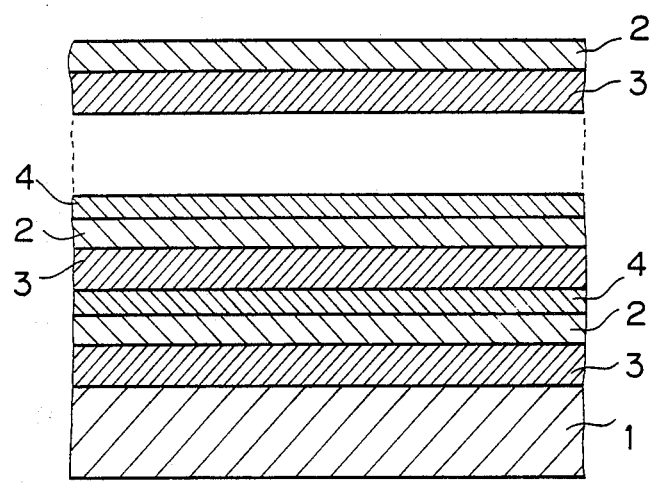

The magnetic field shield including a superconductive film of the first embodiment of the present invention comprises a metal substrate 1 of copper, aluminum, nickel, stainless steel or niobium-titanium alloy and a superconductive film 2 constituted primarily by a mixed crystalline body of niobium and titanium nitride (hereafter referred to as NbN and TiN) and laminated on the metal substrate 1.

The magnetic field shield including a superconductive film of the second embodiment of the present invention comprises the metal substrate 1, a layer 3 of niobium-titanium alloy (hereafter referred to as Nb-Ti alloy) and the above-mentioned superconductive film layer 2, wherein the layers 2 and 3 are laminated in that order on the above-mentioned metal substrate 1.

The magnetic field shield including a superconductive film of the third embodiment of the present invention comprises the metal substrate 1, the Nb-Ti alloy layer 3, the superconductive film layer 2 and another Nb-Ti alloy layer 3, wherein the layers 3, 2, 3 are laminated in that order on the above-mentioned metal substrate 1. The magnetic field shield including a superconductive film of the fourth embodiment of the present invention comprises the above metal substrate 1 and a plurality of sandwiches each of which consists in essence of the Nb-Ti alloy layer 3, the superconductive film layer 2 and the metal film layer 4 in that order, wherein the upmost sandwich disposes with the metal layer 4.

The magnetic field shield including a superconductive film of the fifth embodiment of the present invention comprises the metal substrate 1 and a plurality of sandwiches each of which consists in essence of the Nb-Ti alloy layer 3, the superconductive film layer 2, the Nb-Ti alloy layer 3 and the metal film layer 4 in that order, wherein the upmost sandwich dispenses with the metal layer 4.

Furthermore, as an embodiment relating to the first to fifth embodiments, a magnetic field shield including a superconductive film has a plurality of small holes 5 passing through all shield layers.

The superconductive film layer 2 is formed by the reactive sputtering method in the atmosphere of argon and nitrogen gases using the Nb-Ti alloy as a target. The formed film is constituted primarily of a mixed crystalline body (when the above-mentioned method is used, the mixed crystalline body normally occupies 70 or more weight percent) represented by the following composition formula.

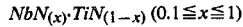

$NbN_{(x)} \cdot TiN_{(1-x)} \quad (0.1 \leq x \leq 1)$

The film also consists in a small amount of Nb, Ti, NbTi and others (30 or less weight percent in total when the above-mentioned method is used). The value of x can be adjusted as desired by changing the composition ratio of the Nb-Ti alloy. The Nb-Ti alloy layer 3 and the metal film layer 4 can also be formed by sputtering. When forming the superconductive film layer 2 by the reactive sputtering method, this forming is possible regardless of whether the substrate 1 is heated or not. However, the magnetic field shielding effect obtained when the substrate 1 is not heated is higher by 10 to 20% than the effect obtained when heated, as described below regarding the embodiments. The thickness of the superconductive film layer 2 should be 10 μm or less, or preferably several micrometers. If the thickness exceeds 10 μm, the shielding effect becomes unstable and reduces.

Although the Nb-Ti alloy layer 3 itself has a superconductive characteristic, it functions to firmly join the superconductive film layer 2 with the metal substrate 1. The thickness of the alloy layer 3 should be 100 μm or less. If the thickness exceeds 100 μm, the shielding effect becomes unstable and reduces in the same way as described below. The metal substrate 1 functions to cool the superconductive layers and is made of a metal with a high thermal conductivity, such as copper, aluminum, nickel, stainless steel or titanium.

The metal film layer 4 is interposed between the superconductive layers to cool the layers. It is also made of a metal with a high thermal conductivity.

The small holes 5 have electromagnetic shielding effects as described in the prior applications (Japanese patent application No. 62-068499 and others). The area of the small hole 5 should be 3 cm² or less and the overall areal porosity should be 90% or less. If the area exceeds 3 cm² and the areal porosity exceeds 90%, the strength of the laminated layers is insufficient in an intense magnetic field, and the area of the superconductive film layer 2 is made smaller. This reduces the shielding current (which flows to generate the magnetic field used to cancel the environmental magnetic field) required to shield an intense magnetic field. In addition, if the area exceeds 3 cm², the magnetic field to be shielded inside each small hole has an inclination, preventing complete shielding at each small hole. On the other hand, if the area of the small hole is too small, clogging is apt to occur during sputtering.

The functions of the magnetic field shield including a superconductive film of the present invention are detailed below. The magnetic field shield of the first embodiment has the most fundamental structure of the present invention. When this shield is put in an intense magnetic field, it delivers an excellent magnetic field shielding effect even when the thickness of the superconductive film layer 2 is only several micrometers. This is caused by the magnetic field shielding effect peculiar to NbN·TiN. This effect is stabilized by the cooling effect of the substrate 1. The excellent magnetic field shielding effect can thus be maintained.

The magnetic field shield of the second embodiment is devised to firmly join the superconductive film layer 2 with the substrate 1. The Nb-Ti alloy layer 3 is sandwiched between the substrate 1 and the superconductive film layer 2. When NbN·TiN is directly fixed on the metal substrate 1 by sputtering. It frequently peels off in the shape of scale, since it has no affinity with metal. When the Nb-Ti alloy layer 3 is sandwiched between the substrate 1 and the superconductive film layer 2 as in the case of the second embodiment, all the layers are firmly joined, since the metal layer 3 has a good affinity with both the substrate 1 and the superconductive film layer 2. Moreover, since the Nb-Ti alloy itself is a superconductor, the magnetic field shielding effect is further increased by the superconductivity of this alloy.

The magnetic field shield of the third embodiment is made by laminating the Nb-Ti alloy layer 3 on the surface of the superconductive film layer 2 of the second embodiment. With this structure, the magnetic field shielding effect of the Nb-Ti alloy layer 3 laminated on the top is added, increasing the overall magnetic field shielding effect.

The magnetic field shield of the fourth embodiment comprises a metal substrate 1 of copper, aluminum, nickel, stainless steel, titanium, niobium or niobium-titanium alloy and a plurality of laminated sandwiches each of which consists in essence of a niobium-titanium alloy layer 3, a superconductive film layer 2 constituted principally by a mixed crystalline body of niobium nitride and titanium nitride and a metal layer 4 in that order, wherein the upmost sandwich dispenses with said metal layer. The superconductive film layer 2 is interposed between the metal thin film layer 4 and the substrate 1. With this structure, all the superconductive layers can be cooled and stabilized even when this embodiment has a plurality of the laminated sandwiches. More specifically, the cooling effect is significant at all the areas of the superconductive film layer 2. Temperature rise due to magnetic flux flow is thus reduced and the current branches are formed at portions where the superconduction state is converted into the normal conduction state to reduce heat generation and to restore the superconduction state. Generally speaking, when a plurality of superconductive layers are exposed to an intense magnetic field, the first layer is exposed to the most intense magnetic field. The second and the subsequent layers are exposed to weaker magnetic fields. At the final layer, the intensity of the magnetic field becomes nearly zero. This shielding effect is possible only when all the layers operate stably. If a flux jumping occurs at the first layer for example, an abrupt magnetic field change occurs at the second layer, and a flux jumping also occurs at the second layer, resulting in that the desired magnetic field shielding effect cannot be obtained. With the fourth embodiment, since the superconductive layers are cooled by the metal film layer 4, the layers can function stably, and the magnetic shielding effect is maintained at a high level. Moreover, all the layers are firmly joined since the Nb-Ti alloy layer 3, interposed between the superconductive film layer 2 and the metal film layer 4, has a good affinity with the superconductive film layer 2 and the metal film layer 4. It is not always the case to dispense with the thin metal film layer 4 on the top. In the case of higher heat radiation effect is required, the metal film layer 4 on the top be better to exist (not shown).

The magnetic field shield of the fifth embodiment comprises a metal substrate 1 of copper, aluminum, nickel, stainless steel, titanium, niobium or niobium-titanium alloy and a plurality of laminated sandwiches each of which consists in essence of a niobium-titanium alloy layer 3, a superconductive film layer 2 constituted principally by a mixed crystalline body of niobium nitride and titanium nitride, another niobium-titanium alloy layer 3 and a metal film layer 4 in that order, wherein the upmost sandwich dispenses with said metal layer.

The superconductive layer 2 is interposed between the metal film layers 4 via Nb-Ti alloy layer 3.

With this structure, all the superconductive layers are cooled and stabilized by the metal film layer 4 even when this embodiment has a plurality of laminated sandwiches. In addition, since the Nb-Ti alloy layers 3 are laminated on both the top and bottom sides of the metal film layer 4, all the layers are firmly integrated.

Figure 5:
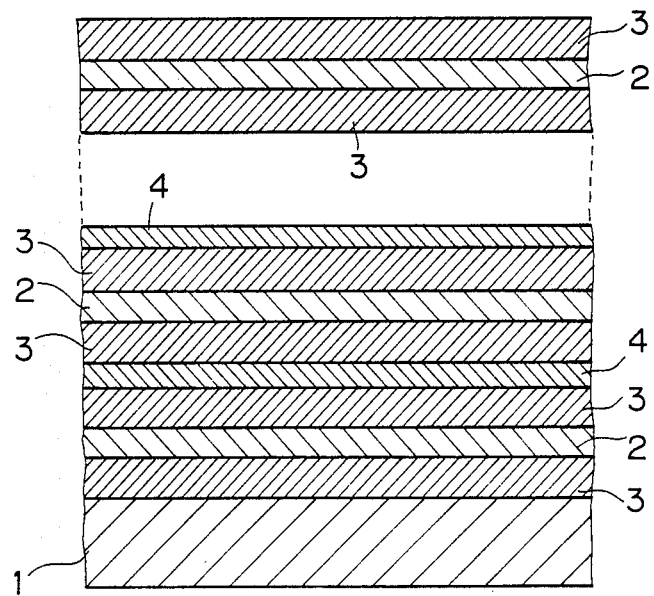
Figure 6:
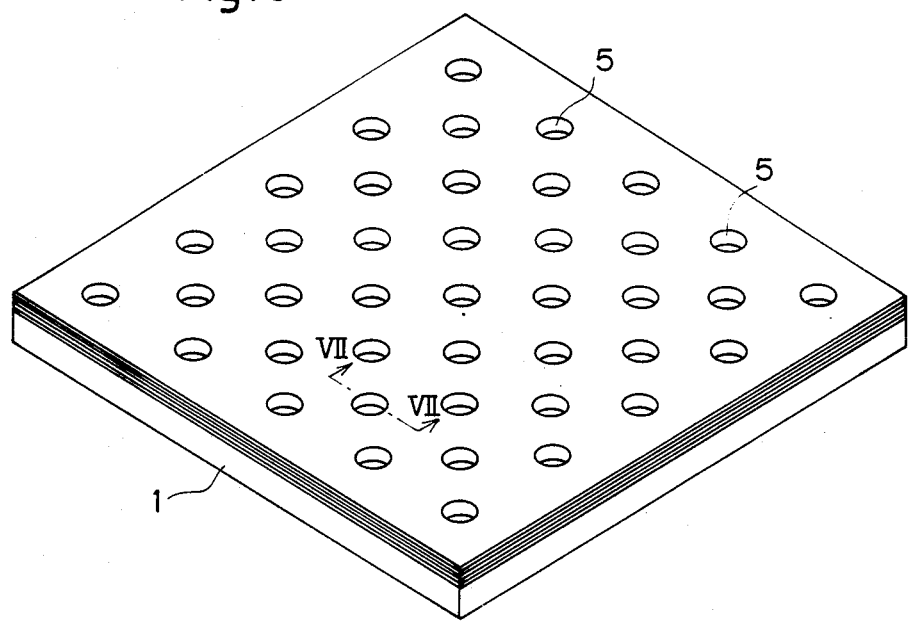
FIG. 6 is a perspective view illustrating one of the embodiments of the magnetic field shield.
Figure 7:
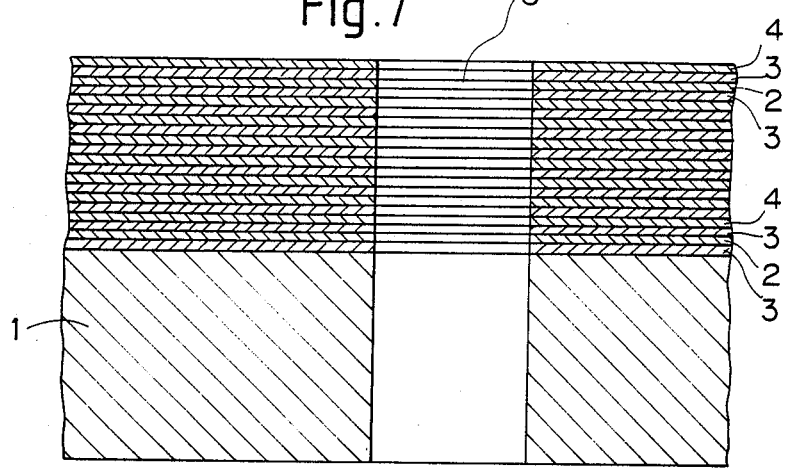
FIG. 7 is a sectional view taken on line VII—VII of FIG. 6.

Usually, the metal film layer 4 on the top can be dispensed with, but for the purpose of higher heat radiation such metal layer 4 is better provided (FIG. 5). When this small holes 5 passing through the magnetic field shields of the above first to fifth embodiments are provided in the direction of the thickness, electromagnetic shielding is produced at the small hole sections and superconductive shielding is produced at the other sections using complete diamagnetism and mixed-condition diamagnetism (mixture of superconduction and normal conduction). These two shielding effects are taken synergistically and extremely high magnetic field shielding can be produced. In the case of electromagnetic shielding, shielding current flows in a closed circuit composed of a superconductor to cancel the magnetic field to be shielded by generating a magnetic field opposite to the magnetic field to be shielded. As the critical current density of the superconductor increases, intense magnetic fields can be shielded more efficiently and stably. By making the superconductive film layer 2 thinner, the intensity of the upper critical magnetic field and the critical current density of the layer become larger than those of the bulk of the similar kind. Therefore, the shield devised by combining the above-mentioned two shielding methods can be used to shield extremely intense magnetic fields. Accordingly, a relatively smaller amount of superconductive material is required to shield the magnetic field of the desired intensity. Unlike a network shield, the magnetic field shield of the present invention does not require any joining or soldering section used to form closed circuits. When the magnetic shield is used at a temperature below the critical temperature, the entire resistance of the closed circuit (the circumference of the small hole) to be shielded becomes zero. Complete shielding is thus possible regardless of whether the magnetic field to be shielded is uniform or variable. The magnetic field shield of the present invention has thus limitless applications. Furthermore, unlike a uniform magnetic field shield sheet which has no small hole in its substrate, the magnetic field shield of the present invention with the small holes 5 allows refrigerant to enter the interiors of the small holes so that the entire area can be fully cooled. Magnetic fluxes can be forcibly trapped at the circumferential sections of the small holes to prevent heat generation due to magnetic flux flow. Therefore, an extremely stable effect is obtained even in a magnetic field of a high intensity.

As described above, as the superconductive film layer 2 becomes thinner, the effect is stabler. Even if the thickness of the superconductive film layer 2 is made smaller than the entry depth of a magnetic flux, the magnetic field shield of the present invention can shield a magnetic field whose intensity is higher than that of the upper critical magnetic field of the bulk of the similar kind due to the following reasons.

Since the entry depth of a magnetic flux is larger than the coherence length (depth from the superconductor surface where superconduction electrons can exist) in the case of the second class superconductor, the electric resistance remains zero even when the thickness of the film layer is smaller than the entry depth of the magnetic field. The intensity of the upper critical magnetic field for the shield of the present invention is higher than that for the bulk of the similar kind.

When the thickness of a conventional magnetic field shield including superconductive film layers is made smaller than the entry depth of the magnetic flux to obtain a stable effect, the most part of the magnetic field passes through the magnetic field shield regardless of the intensity of the magnetic field and the number of superconductive layers, and shielding becomes very difficult. On the other hand, the magnetic field shield with small holes 5 also produces an electromagnetic shielding effect. Even when the thickness of the superconductive film layer 2 is smaller than the entry depth of the magnetic flux, shielding current flows due to zero resistance of the superconductive layer and the magnetic shielding effect is thus not lost.

Even the small holes 5 are provided in a magnetic field shield including a plurality of the superconductive film layers 2, the cooling and stabilization effect of the metal film layers interposed between the superconductive film layers 2 is the same as that described above.

The examples of the above-mentioned embodiments are described as follows.

EXAMPLES

[I] Layers were laminated on a 40 μm thick titanium substrate with no holes as described below to form magnetic field shields. These magnetic field shields were put in an intense magnetic field and the maximum magnetic field shielding amounts were measured. The measurement results were listed on the tables below. The superconductive film layers were formed by the reactive sputtering method in the atmosphere of argon and nitrogen gases using the Nb-Ti alloy as a target as described above. The NbN.TiN mixed crystal body occupies 80 to 90 weight percent of the formed film. In the table below, *1 represents the thickness of the superconductive film layer and *2 represents the thickness of the Nb-Ti alloy.

(1) Examples of the first embodiment

TABLE 1

| Example No. | Shield structure *1 | Layers | Maximum shielding amount (Tesla) |
|---|---|---|---|
| 1 | 1 | 1 | 0.060 |
| 2 | 5 | 1 | 0.236 |
| 3 | 10 | 1 | 0.266 |

(Film thickness unit: μm in the above and below tables) According to table 1, it is understood that a high magnetic field shielding effect is obtained even if the superconductive film layer is thin. The number of layers in the table is that of the superconductive film layers.

(2) Examples of the second embodiment

The metal substrates heated at approximately 300° C. during the above-mentioned sputtering were compared with those not heated during the sputtering.

(2-i) When the metal substrates were heated:

TABLE 2

| Example No. | Shield structure *2 | *1 | Layers | Maximum shielding amount (Tesla) |
|---|---|---|---|---|
| 4 | 1 | 0.5 | 1 | 0.081 |
| 5 | 1 | 1 | 1 | 0.123 |
| 6 | 1 | 5 | 1 | 0.235 |
| 7 | 2 | 0.5 | 1 | 0.108 |
| 8 | 2 | 1 | 1 | 0.148 |
| 9 | 2 | 2 | 1 | 0.206 |
| 10 | 2 | 5 | 1 | 0.268 |
| 11 | 2 | 10 | 1 | 0.150 |
| 12 | 10 | 0.5 | 1 | 0.120 |
| 13 | 10 | 1 | 1 | 0.152 |
| 14 | 10 | 2 | 1 | 0.198 |
| 15 | 10 | 10 | 1 | 0.120 |

The number of layers represent the number of composite film layers. One composite film layer (hereafter referred to as a composite film a) is a combination of a superconductive film layer and a Nb-Ti alloy layer. According to table 2, it is understood that a high magnetic field shielding effect can be obtained even when the superconductive film layer is thin.

(2-ii) When the metal substrates were heated:

TABLE 3

| Example No. | Shield structure *2 | *1 | Layers | Maximum shielding amount (Tesla) |
|---|---|---|---|---|
| 16 | 1 | 0.5 | 1 | 0.072 |
| 17 | 2 | 0.5 | 1 | 0.091 |
| 18 | 2 | 1 | 1 | 0.125 |

The meaning of the number of layers is the same as that described above. The examples 16, 17 and 18 on this table correspond to the examples 4, 7 and 8 on table 2. When these are compared, it is clearly obvious that the magnetic field shielding effects of the non-heated metal substrates are higher than those of the heated metal substrates by 10 to 20%. This is explained as follows. When a metal substrate is heated, the superconductive film layer is subjected to a stress and diffusion occurs between layers, slightly reducing the shielding characteristic.

(3) Examples of the third embodiment

In the same way as described above, the metal substrates heated at approximately 300° C. during the above-mentioned sputtering were compared with those not heated during the sputtering.

(3-i) When the metal substrates were not heated:

TABLE 4

| Example No. | Shield structure *2 | *1 | *2 | Layers | Maximum shielding amount (Tesla) |
|---|---|---|---|---|---|
| 19 | 1 | 0.5 | 1 | 1 | 0.102 |
| 20 | 1 | 1 | 1 | 1 | 0.143 |
| 21 | 1 | 2 | 1 | 1 | 0.193 |
| 22 | 2 | 0.5 | 2 | 1 | 0.152 |
| 23 | 2 | 1 | 2 | 1 | 0.193 |
| 24 | 5 | 0.5 | 5 | 1 | 0.185 |
| 25 | 5 | 2 | 5 | 1 | 0.260 |
| 26 | 10 | 0.5 | 10 | 1 | 0.172 |
| 27 | 10 | 5 | 10 | 1 | 0.101 |
| 28 | 10 | 10 | 10 | 1 | 0.085 |

The number of layers represents the number of composite film layers. One composite film layer (hereafter referred to as a composite film b) is a combination of a Nb-Ti alloy layer, a superconductive film layer and another Nb-Ti alloy layer. According to table 4, it is understood that a synergetic magnetic field shielding effect of the Nb-Ti alloy layer is obtained.

(3-ii) When the metal substrates were heated:

TABLE 5

| Example No. | Shield structure *2 | *1 | *2 | Layers | Maximum shielding amount (Tesla) |
|---|---|---|---|---|---|
| 29 | 1 | 0.5 | 1 | 1 | 0.093 |
| 30 | 1 | 1 | 1 | 1 | 0.129 |
| 31 | 2 | 1 | 2 | 1 | 0.165 |

The meaning of the number of layers is the same as that described above. The examples 29, 30 and 31 on this table correspond to the examples 19, 20 and 23 on table 4. When these are compared, it is also understood that the magnetic field shielding effects on the non-heated metal substrates are higher than those of the heated metal substrates by 10 to 20%.

(4) Examples of the fourth embodiment

TABLE 6

| Example No. | Shield structure *2 | *1 | Layers | Maximum shielding amount (Tesla) |
|---|---|---|---|---|
| 32 | 1 | 0.5 | 10 | 0.79 |
| 33 | 1 | 0.5 | 30 | 2.21 |
| 34 | 1 | 1 | 10 | 1.20 |
| 35 | 2 | 0.5 | 20 | 2.06 |

The number of layers represent the number of the composite films a. An aluminum film layer is interposed between two composite film layers. The examples 32 and 33 on this table correspond to the example 4 on table 2. In the same way, the example 34 correspond to the example 5 and the example 35 correspond to the example 7. It is understand that the magnetic field shielding amount increases in proportion to the number of layers.

(5) Examples of the fifth embodiment

TABLE 7

| Example No. | Shield structure | | | | Maximum shielding amount (Tesla) |
|---|---|---|---|---|---|
| | *2 | *1 | *2 | Layers | |
| 36 | 1 | 0.5 | 1 | 20 | 1.96 |
| 37 | 1 | 1 | 1 | 20 | 2.70 |
| 38 | 2 | 0.5 | 2 | 20 | 2.90 |

The number of layers represent the number of the composite films b. An aluminum film layer is interposed between two composite film layers. The examples 36 on this table correspond to the example 19 on table 4. In the same way, the example 37 corresponds to the example 20 and the example 38 corresponds to the embodiment example 22. Here again it is understand that the magnetic field shielding amount increases in proportion to the number of layers.

[II] Examples equipped with small holes

A plurality of small holes were provided in the above-mentioned magnetic field shields of the first to fifth embodiments and the maximum magnetic field shielding amounts of the shields were measured. The small holes were 2 mm in diameter and the areal porosity was 20%. Layers were laminated on the substrate.

(1) Examples of the first embodiment with small holes

TABLE 8

| Example No. | Shield structure | | Maximum shielding amount (Tesla) |
|---|---|---|---|
| | *1 | Layers | |
| 39 | 1 | 1 | 0.055 |
| 40 | 5 | 1 | 0.262 |
| 41 | 10 | 1 | 0.315 |

The number of layers represent that described on table 1.

(2) Examples of the second embodiment with small holes

TABLE 9

| Example No. | Shield structure | | | Maximum shielding amount (Tesla) |
|---|---|---|---|---|
| | *2 | *1 | Layers | |
| 42 | 2 | 0.5 | 1 | 0.100 |
| 43 | 2 | 1 | 1 | 0.138 |
| 44 | 2 | 5 | 1 | 0.307 |
| 45 | 10 | 0.5 | 1 | 0.144 |
| 46 | 100 | 0.5 | 1 | 0.125 |

The number of layers represents that described on table 2.

(3) Examples of the third embodiment with small holes

TABLE 10

| Example No. | Shield structure | | | | Maximum shielding amount (Tesla) |
|---|---|---|---|---|---|
| | *2 | *1 | *2 | Layers | |
| 47 | 1 | 0.5 | 1 | 1 | 0.094 |
| 48 | 2 | 0.5 | 2 | 1 | 0.143 |
| 49 | 2 | 1 | 2 | 1 | 0.180 |
| 50 | 10 | 1 | 10 | 1 | 0.239 |
| 51 | 100 | 1 | 100 | 1 | 0.190 |

The number of layers represents that described on table 4.

(4) Examples of the fourth embodiment with small holes

TABLE 11

| Example No. | Shield structure | | | Maximum shielding amount (Tesla) |
|---|---|---|---|---|
| | *2 | *1 | Layers | |
| 52 | 2 | 0.5 | 10 | 1.00 |
| 53 | 2 | 0.5 | 30 | 3.00 |
| 54 | 2 | 1 | 10 | 1.38 |

The number of layers represents that described on table 4.

(5) Examples of the fifth embodiment with small holes

TABLE 12

| Example No. | Shield structure | | | | Maximum shielding amount (Tesla) |
|---|---|---|---|---|---|
| | *2 | *1 | *2 | Layers | |
| 55 | 1 | 0.5 | 1 | 10 | 0.94 |
| 56 | 1 | 0.5 | 1 | 30 | 2.82 |
| 57 | 2 | 1 | 2 | 10 | 1.80 |

The number of layers represents that described on table 7. According to tables 8 to 12, it is understood that the magnetic field shielding effects of the examples with small holes are fairly higher than those of the examples without small holes. It is explained that this is caused by the electromagnetic shielding effect of the small holes. According to tables 8 to 10, it is understood that the magnetic field shielding effects of the magnetic shields with small holes are slightly higher than those of the magnetic shields without small holes when the superconductive film layers are relatively thick (5 $\mu$m or more). According to tables 11 and 12, the magnetic field shielding effects of the magnetic shields with small holes are completely proportional to the number of layers. This can be explained as follows. Unlike a magnetic shielding sheet without small holes, the magnetic field shield with small holes allows refrigerant to enter the interiors of the small holes and the entire area can be fully cooled. Magnetic fluxes can be forcibly trapped at the small hole sections to prevent heat generation due to magnetic flux flow. Therefore, extremely stable effect is obtained even in a magnetic field of a high intensity. Even though the Nb-Ti alloy layer itself has a characteristic of a superconductor, it functions to firmly integrate the substrate with the superconductive film layers in the case of the present invention. Therefore, the thickness of the Nb-Ti alloy layer has no limitation. However, if the Nb-Ti alloy layer exceeds 100 $\mu$m as in the case shown in tables 9 and 10, the magnetic field shielding effects of the composite films a and b are apt to reduce. It is understood that this is caused by reduction of the above-mentioned stabilization effect.

Although titanium is used in the substrate and metal film layers of the above examples, other metals or alloys can also produce the similar results. This has been confirmed by the experiments conducted by the inventors of the present invention.

As described above, the magnetic field shield including a superconductive film of the first embodiment can shield an extremely intense magnetic field due to the magnetic field shielding effect peculiar to the superconductor film layer primarily composed of NbN.TiN even though the thickness of the film is as thin as several micrometers. Furthermore, since the superconductive film layer is integrated with a metal substrate, the shielding effect can be stabilized by the cooling effect of the substrate. As a result, the superior magnetic field shielding effect can be maintained.

In the case of the magnetic field shield including a superconductive film of the second embodiment, a Nb-Ti alloy layer is interposed between the substrate and the superconductive film layer of the magnetic field shield including a superconductive film of the first embodiment. Since the Nb-Ti alloy layer has a good affinity with both the substrate and the superconductive film layer, the lamination has high resistance against peeling and is very practically useful. Moreover, the superconductive characteristic of the Nb-Ti alloy layer is added in order to increase the magnetic field shielding effect. In the case of the magnetic field shield including the superconductive film of the third embodiment, the superconductive characteristic of the Nb-Ti alloy layer is added to the second embodiment in order to further increase the magnetic field shielding effect.

In the case of the magnetic field shield including the superconductive film layers of the fourth embodiment, a combination of the Nb-Ti alloy layer and the superconductive film layer use in the second embodiment is repeatedly laminated by interposing a metal film layer between the two combinations. The magnetic field shielding effect of this type is approximately proportional to the number of the superconductive film layers. The interposed metal film layers produces a cooling effect to stabilize the shielding effect. When a single superconductive layer is compared with a lamination of a plurality of superconductive film layers of the same thickness, the electromagnetic field shielding effect of the lamination is far higher and stabler than that of the single superconductive layer. Therefore, the fourth embodiment has very high practical usefulness. The Nb-Ti alloy layers function to firmly join all layers to provide a multi-lamination structure having high resistance against peeling.

In the case of the magnetic field shield including superconductive film layers corresponding to the fifth embodiment, a combination of the Nb-Ti alloy layer, the superconductive film layer and the Nb-Ti alloy layer of the third embodiment is repeatedly laminated by interposing a metal film layer between the two combinations. The superconductive characteristic of the Nb-Ti alloy layer is added to the fourth embodiment in order to further increase the magnetic field shielding effect.

When a plurality of small holes are provided in the magnetic field shields of the first to fifth embodiments to pass through the shields in the direction of the thickness, the electromagnetic shielding effect and cooling effect of these small holes are added to further increase and stabilize the magnetic field shielding effect.

Therefore, all the embodiments of the magnetic field shield including a superconductive film of the present invention can produce superior and stable magnetic field shielding effects. Since the embodiments can be made light and inexpensive, their practical usefulness is very high.

We claim:

1. A magnetic field shield including a superconductive film wherein said magnetic field shield comprises:
   a metal substrate of copper, aluminum, nickel, stainless steel, titanium, niobium or niobium-titanium alloy;
   a niobium-titanium alloy layer; and
   a superconductive film layer consisting essentially of a mixed crystalline body of niobium nitride and titanium nitride;
   wherein said niobium-titanium alloy layer and said superconductive film layer are laminated in that order on said metal substrate.

2. A magnetic field shield including a superconductive film wherein said magnetic field shield comprises:
   a metal substrate of copper, aluminum, nickel, stainless steel, titanium, niobium or niobium-titanium alloy;
   a niobium-titanium alloy layer;
   a superconductive film layer consisting essentially of mixed crystalline body of niobium nitride and titanium nitride; and
   another niobium-titanium alloy layer;
   wherein said layers are laminated in that order on said metal substrate.

3. A magnetic field shield including a superconductive film wherein said magnetic field shield comprises:
   a metal substrate of copper, aluminum, nickel, stainless steel, titanium, niobium or niobium-titanium alloy; and
   a plurality of laminated sandwiches each of which consists essentially of a niobium-titanium alloy layer, a superconductive film layer consisting essentially of a mixed crystalline body of niobium nitride and titanium nitride, and a metal layer in that order;
   wherein the upmost sandwich layer does not include said metal layer.

4. A magnetic field shield including a superconductive film wherein said magnetic field shield comprises:
   a metal substrate of copper, aluminum, nickel, stainless steel, titanium, niobium or niobium-titanium alloy; and
   a plurality of laminated sandwiches each of which consists essentially of a niobium-titanium alloy layer, a superconductive film layer consisting essentially of a mixed crystalline body of niobium nitride and titanium nitride;
   another niobium-titanium alloy layer; and a metal layer in that order;
   wherein the upmost sandwich layer does not include said metal layer.

5. A magnetic field shield including a superconductive film according to claim 1, 2, 3 or 4, wherein said shield has a plurality of small holes passing through in the direction of the thickness.

6. A magnetic field shield including a superconductive film according to claim 5, wherein the area of each small hole is 3 cm$^2$ or less and the ratio of open area to the total area of said magnetic shield is 90% or less.

* * * * *